United States Patent
Chung et al.

(10) Patent No.: US 6,513,538 B2
(45) Date of Patent: Feb. 4, 2003

(54) METHOD OF REMOVING CONTAMINANTS FROM INTEGRATED CIRCUIT SUBSTRATES USING CLEANING SOLUTIONS

(75) Inventors: Seung-pil Chung, Seoul (KR); Kyu-hwan Chang, Kyungki-do (KR); Young-min Kwon, Suwon (KR); Sang-lock Hah, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/862,525

(22) Filed: May 22, 2001

(65) Prior Publication Data

US 2002/0028585 A1 Mar. 7, 2002

(30) Foreign Application Priority Data

Jul. 18, 2000 (KR) ............................. 00-40986

(51) Int. Cl.⁷ ................................. B08B 6/00
(52) U.S. Cl. ............... 134/1.2; 134/26; 134/30; 134/36; 134/902; 438/704; 438/715; 438/746; 438/906; 216/63; 216/67; 216/74
(58) Field of Search ............... 438/715, 746, 438/704, 906; 216/63, 67, 74; 134/1.2, 26, 30, 36, 902

(56) References Cited

U.S. PATENT DOCUMENTS 5,328,558 A * 7/1994 Kawamura ........... 148/DIG. 17
5,759,971 A * 6/1998 Manako .................... 134/3
5,962,384 A * 10/1999 Cooper et al. ............. 134/2
6,348,420 B1 * 2/2002 Raaijmakers et al. ....... 438/769

FOREIGN PATENT DOCUMENTS

| KR | 1994-0012521 | * | 6/1994 | ......... H01L/21/304 |
| KR | 1999-0016917 |   | 3/1999 | |

OTHER PUBLICATIONS

Handbook of Semiconductor wafer cleaning Technology, Noyes Publications, 1993, p. 393.*

* cited by examiner

Primary Examiner—Randy Gulakowski
Assistant Examiner—M. Kornakov
(74) Attorney, Agent, or Firm—F. Chau & Associates, LLP

(57) ABSTRACT

A method for removing contaminants from an integrated circuit substrate include treating the substrate with a hydrogen peroxide cleaning solution containing a chelating agent, and treating the substrate with hydrogen gas and fluorine-containing gas, and annealing the substrate. Cleaning solutions includes ammonium, hydrogen peroxide, deionized water, and chelating agent. The chelating agent includes one to three compounds selected from the group consisting of carboxylic acid compounds, phosphonic acid compounds, and hydroxyl aromatic compounds. The fluorine-containing gas is a gas selected from the group consisting of nitrogen trifluoride (NF3), hexafluorosulphur ($SF_6$), and trifluorochlorine ($ClF_3$).

20 Claims, 1 Drawing Sheet

METHOD OF REMOVING CONTAMINANTS FROM INTEGRATED CIRCUIT SUBSTRATES USING CLEANING SOLUTIONS

BACKGROUND OF THE INVENTION

1. Field of the Invention

The present invention relates to a solution and method for cleaning integrated circuits, and more particularly to a solution and a method for cleaning a semiconductor or a liquid crystalline display substrate.

2. Discussion of Related Art

Cleaning processes typically play an important role in the manufacture of integrated circuits and semiconductor devices such as memory and liquid crystal device (LCD). The cleaning processes are crucial since integrated circuit substrates are easily contaminated during processing. Contaminants such as metal materials, oxide layers including native oxide layer, and damaged layers or even dust particles appear on substrates and affect the operation and reliability of the device. An effective cleaning process removes the contaminants, increasing manufacture yield rate.

A serial wet cleaning process is presently widely used. Examples of serial wet process are: APM (ammonia hydrogen peroxide mixture) process, SPM (sulfuric acid hydrogen peroxide mixture) process, and HPM (hydrochloric acid hydrogen peroxide mixture) process. The serial wet process can be effective in removing particles, organic contaminants, and metal contaminants, etc.

However, there are problems associated with serial wet processes. For example, the APM process can be effective in removing particles, but it is ineffective in removing metal contaminants. The HPM process can be effective in removing metal contaminants, but the HPM process is extremely corrosive and toxic as well as ineffective in removing particles. To obtain the desired cleaning effect, some manufactures apply these processes by mixing or transforming them appropriately.

As an example, according to a method of sequentially performing SPM, APM, and HPM processes, organic substances on the integrated circuit substrate (hereinafter substrate) are removed by the SPM process, while particles on the substrate are removed by the APM process. Then, the HPM process is performed to remove metal contaminants. However, this process in sequence is complex and manufacturing costs are high. Also there are environmental pollution dangers arising from continuous use of excessive cleaning solution and deionized water for a rinse process. Furthermore, since the SPM, APM, and HPM solution includes hydrogen peroxide ($H_2O_2$), which is a strong oxidizer, an oxide layer is formed chemically on a substrate after cleaning. In addition to the chemical oxide layer, a thin native oxide layer may be formed on a substrate when the substrate reacts with oxygen or water in the atmosphere during integrated circuit manufacturing process. If the thin native oxide is not removed efficiently, it may adversely affect the characteristics of an integrated circuit device. If the native oxide layer is formed on a contact surface, the contact resistance increases. Also, if the native oxide layer is formed before the growth of a gate oxide layer, the characteristics of the gate oxide layer is degraded.

Among methods of removing an oxide layer, one of the most widely-known process is wet cleaning using a hydrofluoric acid (HF) cleaning solution. The HF cleaning solution has an advantage in that the use of HF cleaning solution not only can maintain high selectivity between a substrate and an oxide layer but also forms a hydrogen passivation layer on the silicon substrate surface after cleaning an oxide layer.

However, there are disadvantages using the wet cleaning process with the HF cleaning solution. Since the process is difficult to perform in-situ and a long time wait is often required, step-by-step contamination control is difficult. Furthermore, during a subsequent process for dry cleaning of the substrate, the substrate is susceptible to contaminate. In addition, during the cleaning of a small and deep contact hole, it is difficult for the cleaning solution to flow into or flow out of the contact hole; therefore, the process cannot completely remove the oxide layer and cleaning residues in the small and the deep hole.

SUMMARY OF THE INVENTION

A method for removing contaminants from an integrated circuit substrate is provided. The method comprises first treating the substrate with a hydrogen peroxide cleaning solution containing a chelating agent. Subsequently, the substrate is treated with hydrogen gas and fluorine-containing gas, and the substrate is annealed.

According to an aspect of the invention, the hydrogen peroxide cleaning solution comprises ammonium, hydrogen peroxide, deionized water and a chelating agent and the temperature of the cleaning solution is about 40° C. to about 80° C.

According to a preferred embodiment of the invention, the chelating agent is present in an amount ranging from about 500 ppm to about 5,000 ppm based on the water content of the cleaning solution. The chelating agent includes one to three compounds selected from the group consisting of carboxylic acid compounds, phosphonic acid compounds, and hydroxyl aromatic compounds.

According to an aspect of the invention, the step of treating the substrate with hydrogen gas and fluorine-containing gas is preferably performed at a temperature of about −25° C. to about 50° C. and a pressure of about 0.01 torr to about 10 torr.

According to a preferred embodiment of the invention, the hydrogen gas and the fluorine-containing gas are supplied into a process chamber, the hydrogen gas in a plasma state and the fluorine-containing gas in a natural state. The fluorine-containing gas is a gas selected from the group consisting of nitrogen trifluoride ($NF_3$), hexafluorosulphur ($SF_6$), and trifluorochlorine ($ClF_3$), and the amount of fluorine-containing gas supplied is about 0.1 vol % to 5,000 vol % with respect to the hydrogen gas.

According to an aspect of the invention, the step of annealing the substrate is performed at a temperature of about 100° C. to about 500° C. for about 20 seconds to about 600 seconds.

The method preferably further includes the step of rinsing with ozone water after treating the substrate with the cleaning solution. The cleaning solution treatment and the ozone water rinse are carried out within the same bath and the temperature of the ozone water is about 0° C. to about 30° C. The ozone water includes deionized water and ozone, and the content of ozone is about 1 ppm to 1000 ppm with respect to the deionized water.

DETAILED DESCRIPTION OF PREFERRED EMBODIMENTS

The present invention now will be described more fully hereinafter with reference to the accompanying drawings, in which preferred embodiments of the invention are shown.

Figure 1:
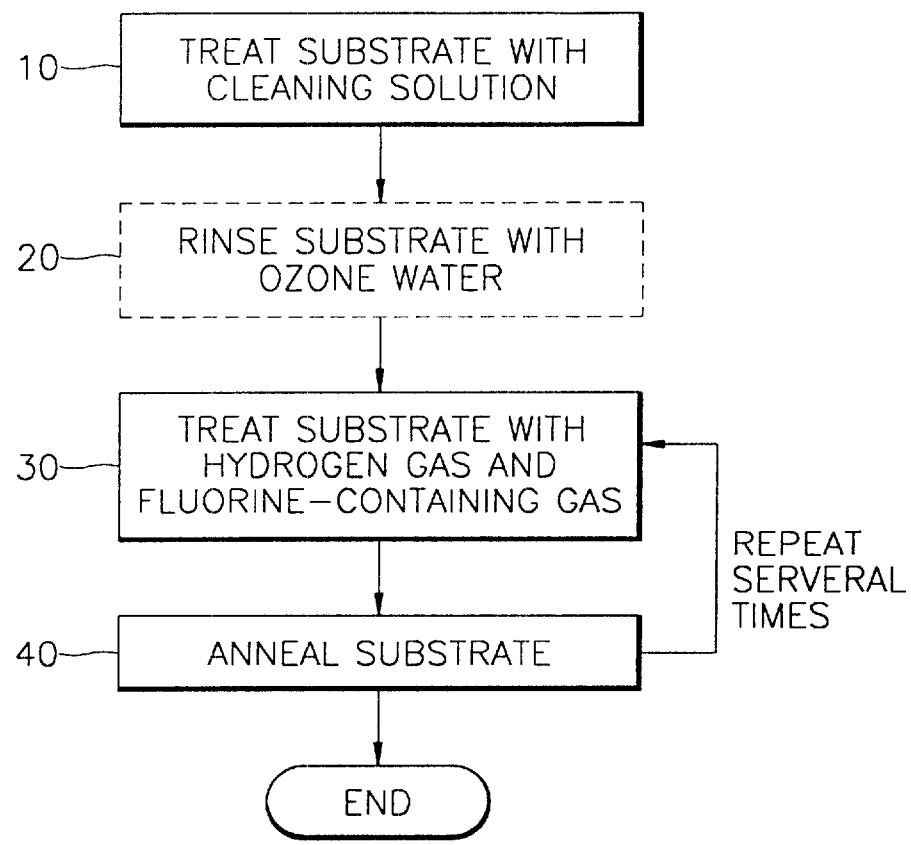
FIG. 1 is a schematic diagram of a cleaning method according to the present invention.

FIG. 1 shows a schematic diagram of a cleaning method according to the present invention. An integrated circuit substrate, e.g., a semiconductor substrate and liquid crystalline display substrate (LCD), on which contaminants are formed are prepared. Then, the substrate is treated with a cleaning solution (step 10). The cleaning solution comprises a basic hydrogen peroxide aqueous solution and a chelating agent. The cleaning solution may be sprayed on the substrate surface, or the substrate may be dipped into a bath holding the cleaning solution. The chelating agent may be used for removing metal contaminants. Typically, there are no restrictions on the chelating agent used. However, preferably, one to about three compounds selected among: carboxylic acid compounds such as citric acid and gluconic acid; phosphonic acid compounds such as hydroxyethane diphosphonic acid and ethylenediamine tetrakismethylenephosphonic acid; and hydroxy aromatic compounds such as catechol, resorcinol, hydroquinone and pyrogallol are used as the chelating agent. A preferred amount of chelating agent added is about 500 parts per million (ppm) to about 5,000 ppm based on the water content of the cleaning solution. If the amount added is below about 500 ppm, the effect of removing metal contaminants is low, while it is above about 5,000 ppm, organic contaminants may be generated.

A cleaning process using a basic hydrogen peroxide acqueous solution cannot remove metal contaminants wholly because of so-called metal reverse contamination, which means detached metals from one part of the substrate are reattached to the other part of the substrate. On the other hand, the chelating agent is coordinately bonded with metal ions in the cleaning solution to form a chelating compound, which prevents the substrate from being re-contaminated by metal contaminants. Furthermore, the cleaning solution can be used repeatedly because the cleaning solution may still clean even though it has been used many times. In the present invention, the step is preferably performed at temperatures ranging from about 40° C. to about 80° C.

Subsequently, the substrate that has been treated with the cleaning solution is rinsed with deionized water or ozone water to remove the residue on the substrate (step 20). The rinse with the ozone water is advantageous in effectively removing organic contaminants which may result from the chelating agent during the cleaning solution treatment (step 10). When the ozone water is used, the temperature of the ozone water is preferably about 0° C. to about 30° C., and the ozone concentration in the ozone water is about 1 ppm to about 1,000 ppm. If the temperature of the ozone water is below about 0° C., a higher concentration of the ozone can be achieved. On the other hand, if the temperature of the ozone water is above about 30° C., the ozone may not be dissolved easily in the water. The rinse process may be performed by an overflow method wherein ozone water or deionized water continuously flows onto the substrate or by a quick dump method wherein the substrate is submerged momentarily in a bath filled with ozone water or deionized water.

Next, the substrate is chemically treated with hydrogen gas plasma and fluorine-containing gas (step 30). The hydrogen gas is provided to a process chamber in a plasma state, and the fluorine-containing gas is provided to the process chamber in its natural state. Preferably, the hydrogen gas and the fluorine-containing gas is mixed at a predetermined ratio before it is supplied to the process chamber, then the mixed gas is supplied together to the process chamber with a carrier gas such as nitrogen and/or argon gases.

Examples of the fluorine-containing gas may include nitrogen trifluoride ($NF_3$), hexafluorosulphur ($SF_6$), and trifluorochlorine ($ClF_3$). Preferably, nitrogen trifluoride ($NF_3$) is used. The mixture ratio of the fluorine-containing gas is about 0.1 vol % to about 5,000 vol % with respect to hydrogen gas. After supplying the hydrogen gas plasma and the fluorine-containing gas to the process chamber, reactions are performed for about 20 seconds to about 600 seconds while controlling process conditions at a temperature of about −25° C. to about 50° C., preferably, about 0° C. to about 50° C., and at a pressure of about 0.01 torr to about 10 torr. As previously mentioned, when the hydrogen gas plasma and the fluorine-containing gas are provided into the process chamber, the hydrogen gas plasma and the fluorine-containing gas chemically react with an oxide layer which is formed on the substrate surface, and then remove the oxide layer. In this case, the oxide layer may be a native oxide layer or an oxide layer to be etched for forming an arbitrary oxide layer pattern.

The treatment with hydrogen gas plasma and fluorine-containing gas (step 30) is based on chemical reaction, unlike conventional reactive ion etching (RIE), so that there is no damage to the substrate surface and also no charge damage. For example, the hydrogen gas plasma and the nitrogen trifluoride ($NF_3$) gas supplied into the process chamber react with the oxide layer, i.e., silicon dioxide, to form a reaction layer ($(NH_4)_2SiF_6$). The reaction layer serves as a barrier layer to prevent a continuous chemical reaction between the fluorine-containing gas and the oxide layer.

After treatment of the substrate with hydrogen gas plasma and fluorine-containing gas, the substrate is annealed to evaporate and to remove the reaction layer serving as the barrier layer (step 40). The annealing is performed at a low temperature, preferably, at a temperature of about 100° C. to about 500° C., for about 20 seconds to about 600 seconds. If the annealing temperature and the time are beyond these ranges, the reaction layer may not be sufficiently removed. The annealing may be performed in-situ or ex-situ.

While the reaction layer is removed by the annealing, the oxide layer at a position where the reaction layer has been formed is then removed, and the surface of the substrate is passivated with hydrogen concurrently. Even though the treatment with hydrogen gas plasma and fluorine-containing gas and the annealing are sufficient to remove the native oxide layer with just one step, the treatment with hydrogen gas plasma and fluorine-containing gas and the annealing can be performed two or more times depending on the thickness of the oxide layer.

Hereinafter, the present invention will now be described in detail by examples and comparative examples.

EXAMPLE 1

First, two substrates were prepared. Both substrates were treated with a metal standard solution to coercively contaminate the surface thereof with metal contaminants. The levels of metal contamination were both 1E13 atoms/$cm^2$. Subsequently, the two substrates were treated with a typical APM cleaning solution and an APM cleaning solution containing a chelating agent, respectively, and then the contamination levels of the treated substrates were measured again. The results were shown in Table 1.

TABLE I

| | Initial metal contamination level | Contamination level after typical APM treatment | Contamination level after chelating agent-added APM treatment |
|---|---|---|---|
| Al | 4.5E13(atoms/$cm^2$) | 5.2E13(atoms/$cm^2$) | 2.1E11(atoms/$cm^2$) |
| Fe | 3.0E13(atoms/$cm^2$) | 1.8E13(atoms/$cm^2$) | 1.7E11(atoms/$cm^2$) |

As shown in Table 1, after treatment with a typical APM, Fe contamination level was decreased. However, Al contamination level was increased. Conversely, after treatment an APM containing the chelating agent was used, both metal (Al and Fe) contamination levels were decreased significantly.

EXAMPLE 2

Two substrates were prepared, and a gate oxide layer was deposited on the substrates. First, one of the two substrates was treated by a typical cleaning method, wherein APM cleaning and HF cleaning were sequentially performed, while the other was treated by a cleaning method according to the present invention, wherein the substrate was first cleaned with an APM cleaning solution to which a chelating agent was added, and then the substrate was treated with a mixture of a gas hydrogen plasma and fluorine-containing gas.

Figure 2:
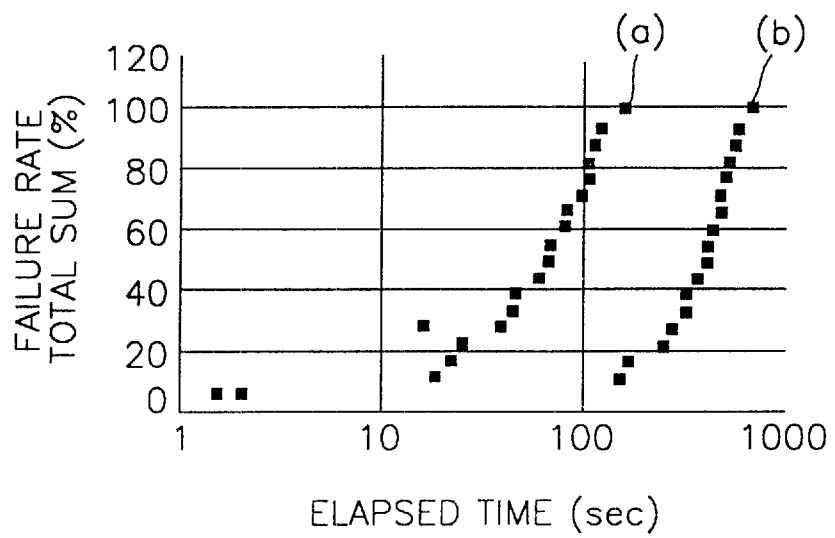
FIG. 2 shows the results of measuring time dependent dielectric breakdown (TDDB) characteristics of an integrated circuit substrate treated by a conventional cleaning method (a) and a method according to the present invention (b).

Subsequently, using a spider mask, the two substrates were patterned. Then, time dependent dielectric breakdown (TDDB) characteristics of the gate oxide layer were measured on the substrates, then the reliability of the gate oxide layer is estimated. The TDDB measurement was performed at room temperature using a current of about 50 A and a voltage of about −7.4 V. Curves (a) and (b) in FIG. 2 represent TDDB characteristics after treatment of the substrate according to the conventional cleaning method (a) and a preferred method of the present invention (b), respectively. As shown in FIG. 2, an elapsed time of curve (b) according to the present invention is much longer than the curve (a) given the failure rate. Therefore, it can be seen that the reliability of the gate oxide layer is much depended upon application of cleaning process according to the present invention.

In a preferred cleaning method of the substrate according to the present invention, various contaminants, such as organic contaminants, particles, and metal contaminants, can be effectively removed. In particular, reverse contamination due to re-attachment of metal contaminants can be avoided, and various oxide layers such as a native oxide layer can be effectively removed without damage to the underlying layers.

Although the present invention has been described herein with reference to the accompany drawings, it is to be understood that the present invention is not limited to those precise embodiments, and various other changes and modifications may be affected therein by one skilled in the art without departing from the scope or sprit of the present invention. All such changes and modifications are intended to be included within the scope of the invention as defined by the appended claims.

What is claimed is:

1. A method for removing contaminants from an integrated circuit substrate, the method comprising:
    treating the substrate with a hydrogen peroxide cleaning solution containing a chelating agent;
    treating the substrate with hydrogen gas and fluorine-containing gas; and
    annealing the substrate to remove a reaction layer formed by treating the substrate with hydrogen gas and fluorine-containing gas wherein the step of annealing the substrate is performed at a temperature of about 100° C. to about 500° C.

2. The method of claim 1, wherein the hydrogen peroxide cleaning solution comprises ammonium, hydrogen peroxide, deionized water and a chelating agent.

3. The method of claim 1, wherein the chelating agent is selected from the group consisting of carboxylic acid compounds, phosphonic acid compounds, hydroxyl aromatic compounds and combinations thereof.

4. The method of claim 1, wherein the chelating agent is present in an amount ranging from about 500 parts per million (ppm) to about 5,000 ppm based on the water content of the cleaning solution.

5. The method of claim 1, wherein the temperature of the cleaning solution is about 40° C. to about 80° C.

6. The method of claim 1, wherein the fluorine-containing gas is selected from the group consisting of nitrogen trifluoride ($NF_3$), hexafluorosulphur ($SF_6$), and trifluorochlorine ($ClF_3$).

7. The method of claim 1, wherein the amount of fluorine-containing gas supplied is about 0.1 vol % to about 5,000 vol % with respect to the hydrogen gas.

8. The method of claim 1, wherein the hydrogen gas and the fluorine-containing gas are supplied into a process chamber, the hydrogen gas in a plasma state and the fluorine-containing gas in a natural state.

9. The method of claim 1, wherein a carrier gas including at least one of nitrogen and argon is provided into the process chamber together with the hydrogen gas and the fluorine-containing gas.

10. The method of claim 1, wherein the step of treating the substrate with hydrogen gas and fluorine-containing gas is performed at a temperature of about −25° C. to about 50° C. and a pressure of about 0.01 torr to about 10 torr.

11. The method of claim 1, wherein the step of treating the substrate with hydrogen gas and fluorine-containing gas is performed for about 20 seconds to about 600 seconds.

12. The method of claim 1, wherein the step treating the substrate with hydrogen gas and fluorine-containing gas, and the step of annealing the substrate are performed within the same process chamber.

13. The method of claim 1, further comprising the step of rinsing with ozone water after treating the substrate with the cleaning solution.

14. The method of claim 13, wherein the cleaning solution treatment and the ozone water rinse are carried out within the same bath.

15. The method of claim 13, wherein the temperature of the ozone water is about 0° C. to about 30° C.

16. The method of claim 13, wherein the ozone water includes deionized water and ozone, and the content of ozone is about 1 ppm to about 1000 ppm with respect to the deionized water.

17. The method of claim 16, wherein the temperature of the ozone water is about 0° C. to about 30° C.

18. The method of claim 1, wherein the step of annealing the substrate is performed for about 20 seconds to about 600 seconds.

19. The method of claim 1, wherein the step of treating the substrate with hydrogen gas and fluorine-containing gas and the step of annealing the substrate are performed one or more times.

20. The method of claim 1, wherein the reaction layer is $(NH_4)_2SiF_6$.

* * * * *